United States Patent
Hsu et al.

(10) Patent No.: US 7,994,515 B2
(45) Date of Patent: Aug. 9, 2011

(54) LIGHT EMITTING DEVICE WITH HIGH LIGHT EXTRACTION EFFICIENCY

(75) Inventors: Chih-Peng Hsu, Miao-Li Hsien (TW); Chih-Pang Ma, Miao-Li Hsien (TW); Wen-Jang Jiang, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 59 days.

(21) Appl. No.: 12/344,647

(22) Filed: Dec. 29, 2008

(65) Prior Publication Data

US 2009/0189167 A1 Jul. 30, 2009

(30) Foreign Application Priority Data

Jan. 30, 2008 (CN) .......................... 2008 1 0300262

(51) Int. Cl.
*H01L 27/15* (2006.01)
*H01L 31/12* (2006.01)
(52) U.S. Cl. .......................................... 257/79; 257/99
(58) Field of Classification Search .................... 257/79, 257/E33.068; 438/22
See application file for complete search history.

(56) References Cited

U.S. PATENT DOCUMENTS

| | | | | |
|---|---|---|---|---|
| 7,288,797 B2* | 10/2007 | Deguchi et al. | ................. | 257/99 |
| 7,652,296 B2* | 1/2010 | Chu | ................................ | 257/79 |
| 2002/0014630 A1* | 2/2002 | Okazaki et al. | ................. | 257/79 |

* cited by examiner

*Primary Examiner* — Zandra Smith
*Assistant Examiner* — Tsz K Chiu
(74) *Attorney, Agent, or Firm* — Clifford O. Chi

(57) ABSTRACT

An exemplary solid-state light emitting device includes a substrate, a light emitting structure, a first electrode and a second electrode have opposite polarities with each other. The light emitting structure includes a first-type semiconductor layer, a second-type semiconductor layer and an active layer between the first-type semiconductor layer and the second-type semiconductor layer. The first electrode electrically is connected with the first-type semiconductor layer. The first electrode includes a first contact pad and a current induced electrode spaced apart and insulated from each other. The second electrode has an opposite polarity with respect to the first electrode. The second electrode includes a transparent conductive layer formed on and electrically connected with the second-type semiconductor layer and a metallic conductive layer formed on the transparent conductive layer and in electrical contact therewith.

4 Claims, 6 Drawing Sheets

LIGHT EMITTING DEVICE WITH HIGH LIGHT EXTRACTION EFFICIENCY

CROSS-REFERENCE TO RELATED APPLICATION

This application is related to the following commonly-assigned copending application: Ser. No. 12/080,637, entitled "LIGHT EMITTING DEVICE WITH HIGH LIGHT EXTRACTION EFFICIENCY". Disclosures of the above-identified application are incorporated herein by reference.

BACKGROUND

1. Technical Field

The present invention generally relates to light emitting devices and, particularly, to a solid-state light emitting device with high light extraction efficiency.

2. Discussion of Related Art

Referring to FIGS. 3 and 4, a typical solid-state light emitting device, e.g., a semiconductor light emitting diode (LED) 600 is illustrated. The LED 600 includes an dielectric substrate 610, a light emitting structure 620 formed on the dielectric substrate 610, an N-electrode 630 and a P-electrode 640. The light emitting structure 620 includes an N-type layer 621, a P-type layer 623 and an active layer 622 sandwiched therebetween. The N-type layer 621 has an exposed portion uncovered by the active layer 622 and the P-type layer 623. The N-electrode 630 is an N-contact pad and formed on the exposed portion of the N-type layer 621. The P-electrode 640 is a P-contact pad and arranged on the P-type layer 623. The N-electrode 630 and the P-electrode 640 are diagonally arranged with each other. However, due to a relatively high resistance of the P-type layer 623, the current injected at the P-electrode 640 does not spread laterally away from the P-electrode 640 and does not spread laterally within the P-type layer 623. Instead, the current flows from the P-electrode 640 along the shortest path (i.e., usually vertically) across the active layer 622 to the N-type layer 621. As a result, an area utilization ratio of the active layer 622 is lowered and thus the light extraction efficiency of the light emitting diode 600, especially with regard to a light emitting diode with a large sized light emitting structure, is degraded.

Referring to FIGS. 5 and 6, in order to overcome the above-mentioned issue associated with the low area utilization ratio of the active layer, an improved light emitting diode 700 is disclosed. The light emitting diode 700 includes a light emitting structure 720 having an N-type layer 721 and a P-type layer 723, a comb-shaped N-electrode 730 and a comb-shaped P-electrode 740. The comb-shaped N-electrode 730 and P-electrode 740 are interdigitated with each other and respectively ohmic contacted with the N-type layer 721 and the P-type layer 723. The use of the comb-shaped N-electrode 730 and P-electrode 740 can macroscopically improve current spreading to some degree, but still subject to current crowding in the microscopical level of the comb-shaped P-electrode 740. Accordingly, the light extraction efficiency of the light emitting diode 700 is low.

Therefore, what is needed is a solid-state light emitting device with good current spreading and thus relatively high light extraction efficiency.

BRIEF DESCRIPTION OF THE DRAWINGS

Many aspects of the present solid-state light emitting device can be better understood with reference to the following drawings. The components in the drawings are not necessarily drawn to scale, the emphasis instead being placed upon clearly illustrating the principles of the present solid-state light emitting device. Moreover, in the drawings, like reference numerals designate corresponding parts throughout the several views.

DETAILED DESCRIPTION

Figure 1:
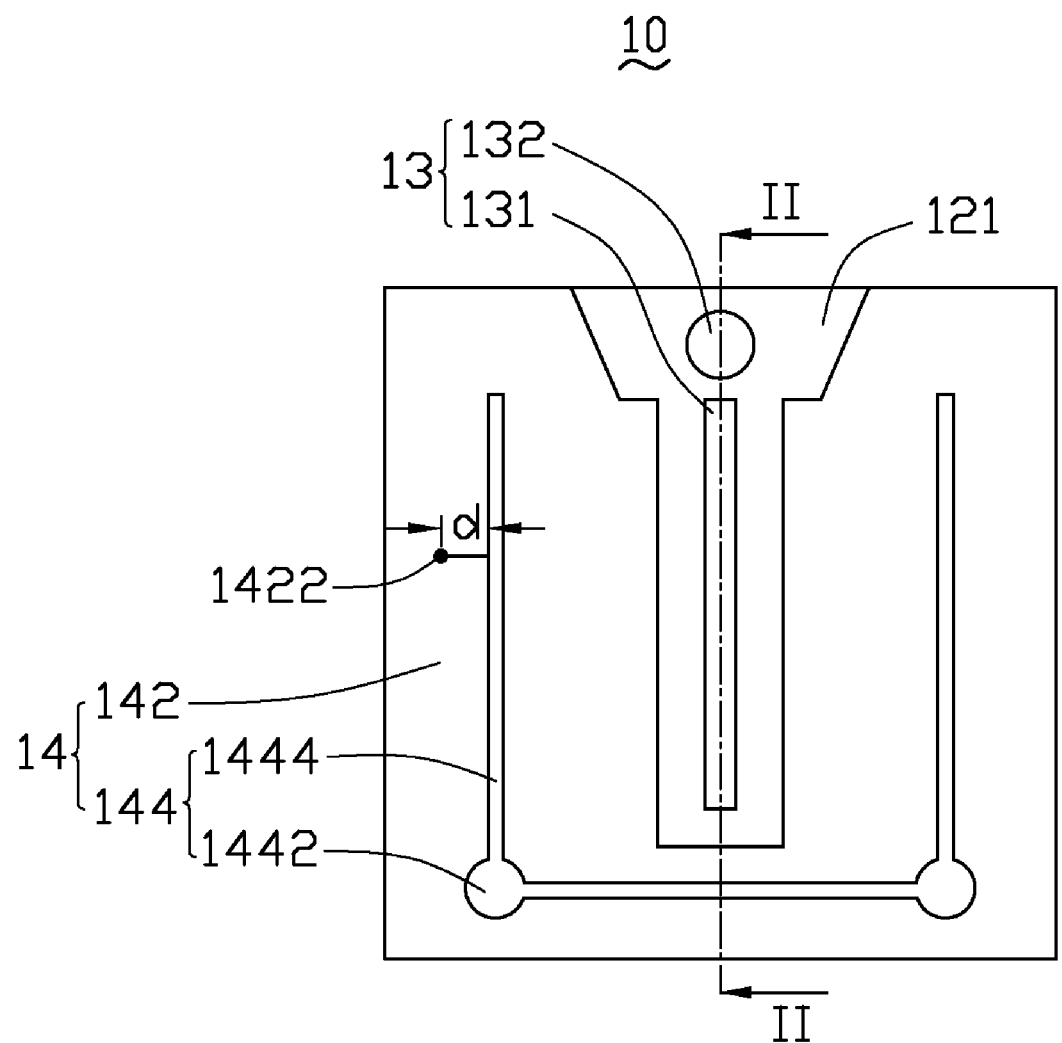
FIG. 1 is a schematic, top view of a solid-state light emitting device, in accordance with an exemplary embodiment.
Figure 2:
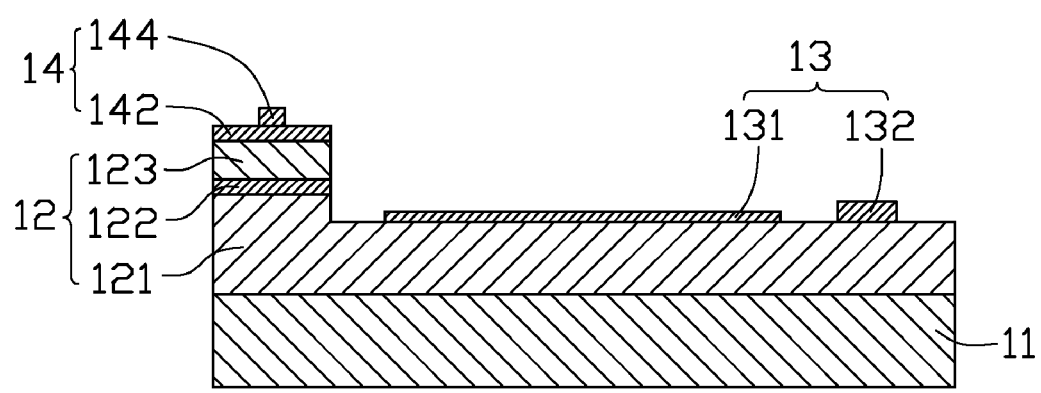
FIG. 2 is a schematic, sectional view of the solid-state light emitting device, taken along the line II-II in FIG. 1.
Figure 3:
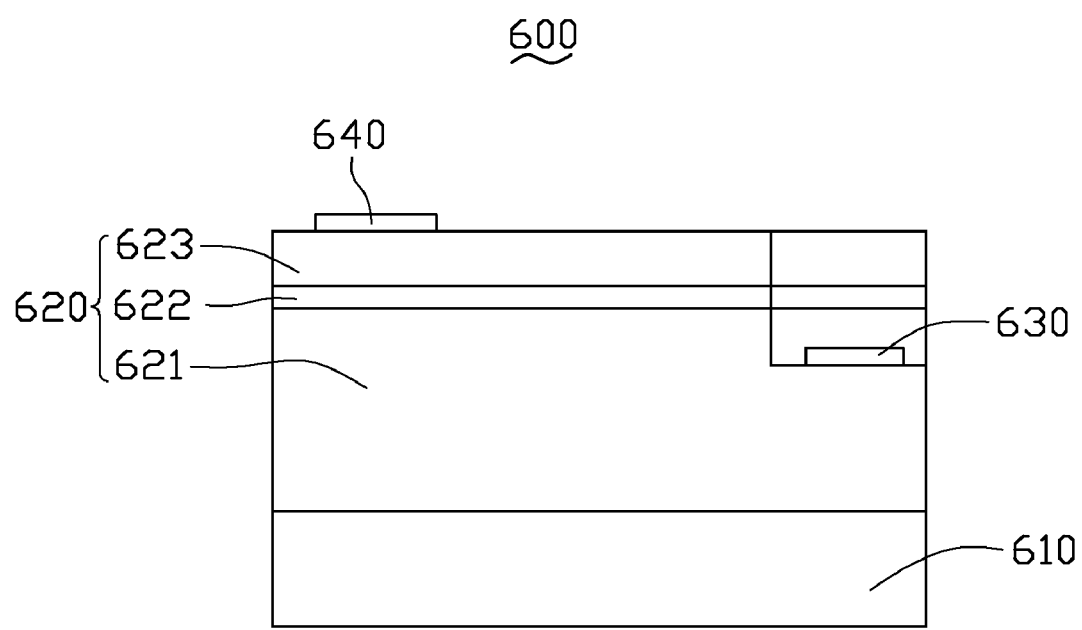
FIG. 3 is a schematic, front view of a typical light emitting diode.
Figure 4:
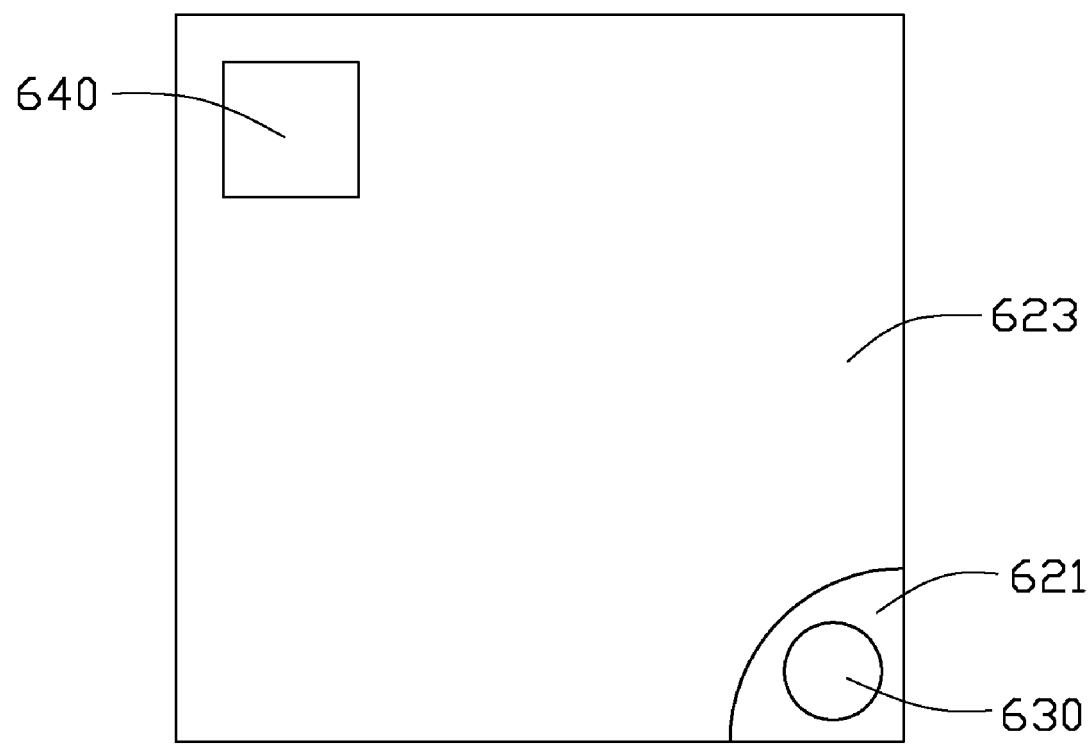
FIG. 4 is a schematic, top view of the light emitting diode of FIG. 3.
Figure 5:
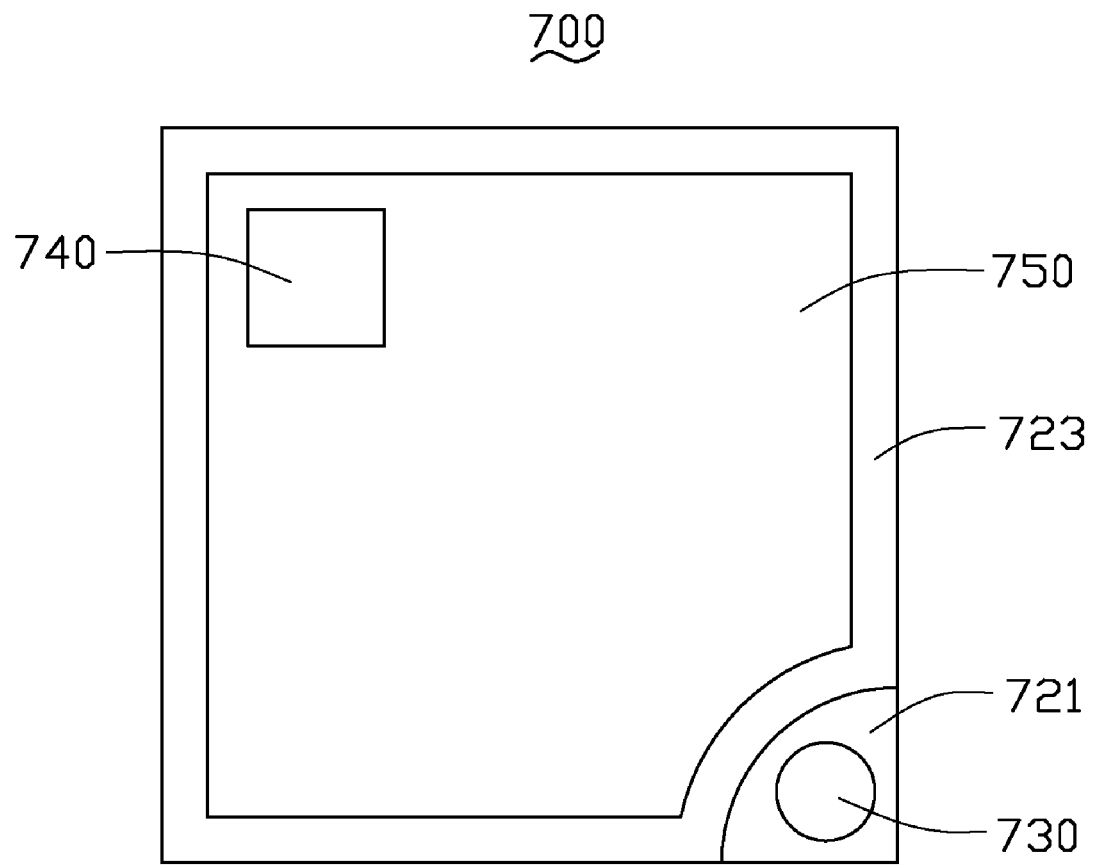
FIG. 5 is a schematic, top view of another typical light emitting diode.
Figure 6:
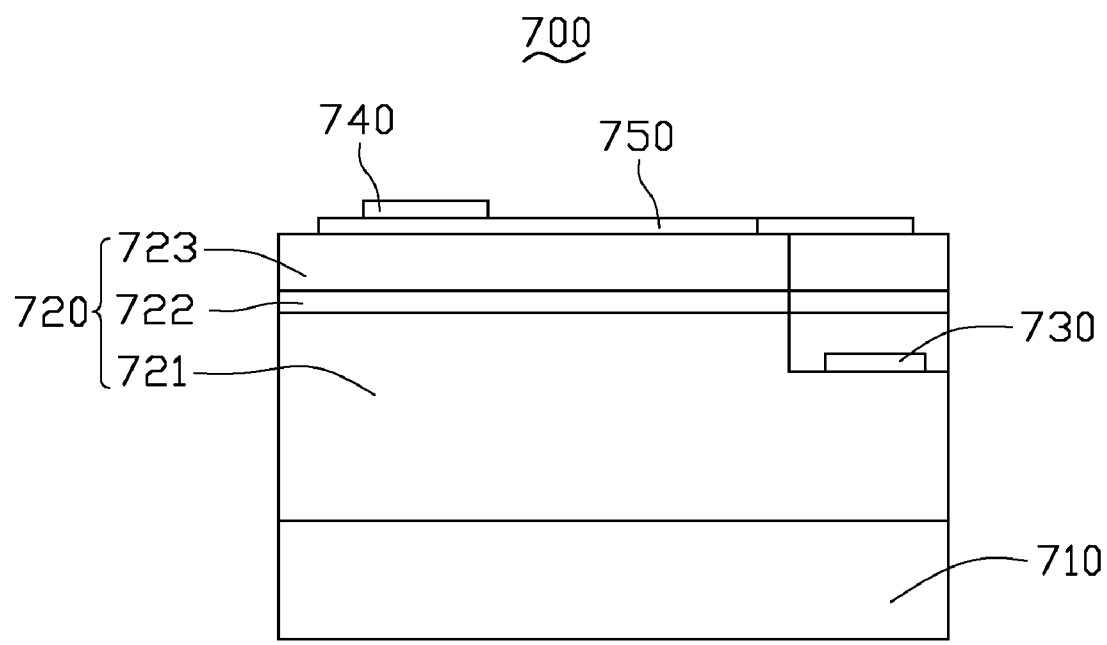
FIG. 6 is a schematic, front view of the light emitting diode of FIG. 5.

Referring to FIGS. 1 and 2, a solid-state light emitting device 10 such as a semiconductor light emitting diode, in accordance with an exemplary embodiment, is provided. The solid-state light emitting device 10 includes a substrate 11, a light emitting structure 12 formed on the substrate 11, a first electrode 13 and a second electrode 14 having opposite polarities with respect to each other.

The substrate 11 is an dielectric substrate. The substrate 11 can be sapphire ($\alpha$-$Al_2O_3$) substrate, silicon carbide (SiC) substrate, etc.

The light emitting structure 12 generally includes a first-type semiconductor layer such as N-type semiconductor layer 121, a second-type semiconductor layer such as P-type semiconductor layer 123, and an active layer 122 sandwiched between the N-type semiconductor layer 121 and the P-type semiconductor layer 123. The N-type semiconductor layer 121, the active layer 122 and the P-type semiconductor layer 123 can be made of III-V or II-VI compound semiconductors. The N-type semiconductor layer 121 is formed on the substrate 11 and has an exposed portion uncovered by the active layer 122 and the P-type semiconductor layer 123. The exposed portion is surrounded by the active layer 122 and the P-type semiconductor 123. It is understood that the light emitting structure 12 can consists of an N-type semiconductor layer and a P-type semiconductor layer and thus the active layer can be omitted.

The first electrode 13 is formed (e.g., deposited) on the exposed portion of the N-type semiconductor layer 121 and electrically contacted therewith. The first electrode 13 includes a current induced electrode 131 and a contact pad 132 adjacent to the current induced electrode 131. The current induced electrode 131 can be strip-shaped, trapezoidal, round or ellipsoidal. The current induced electrode 131 and the contact pad 132 are apart from each other. The contact pad 132 is configured for electrically connecting with an external circuit (e.g., by wire boding). In this embodiment, the current induced electrode 131 is strip-shaped, and the contact pad 132 is aligned with (arranged on a longitudinal extending line of) the current induced electrode 131.

The second electrode 14 is formed on and in electrical contact with the P-type semiconductor layer 123. In particular, the second electrode 14 includes a transparent conductive layer 142 and a metallic conductive layer 144 electrically contacted with the transparent conductive layer 142.

The transparent conductive layer 142 is formed (e.g., deposited) on and in ohmic contact with the P-type semiconductor layer 123. The transparent conductive layer 142 is light-permeable to light emitted from the light emitting structure 12. The transparent conductive layer 142 is beneficially made of a transparent and metal-doped metal oxide, such as indium-doped tin monoxide (SnO:In), tin-doped gallium oxide ($Ga_2O_3$:Sn), tin-doped silver-indium oxide ($AgInO_2$:Sn), indium-tin oxide ($In_2O_3$:Sn), zinc-doped indium oxide ($In_2O_3$:Sn), antimony-doped tin dioxide ($SnO_2$:Sb), or aluminum-doped zinc oxide (ZnO:Al).

The metallic conductive layer 144 is formed (e.g., deposited) on the transparent conductive layer 142 and at an opposite side thereof to the P-type semiconductor layer 123. The metallic conductive layer 144 is generally made of an opaque metal material or metal alloy. The metallic conductive layer 144 includes two contact pads 1442 and three straight strip-shaped extending arms 1444. At least one of the contact pads 1442 connects to an external circuit via wire bonding. The two contact pads 1442 have an extending arm 1444 connected therebetween. The other two extending arms 1444 extend from respective corresponding contact pads 1442 along a direction substantially perpendicular to a lengthwise direction of the extending arm 1444 connected between the contact pads 1442. The other two extending arms 1444 are alternately arranged with current induced electrode 131 of the first electrode 13.

As illustrated in FIG. 1, a random regional cell 1422 on the transparent conductive layer 142 has a distance d from a nearest part of the metallic conductive layer 144. The transparent conductive layer 142 consists of a plurality of regional cell 1422.

Due to the existence of crystal grain boundaries and crystal defects, the lateral spreading current in the transparent conductive layer 142 is mostly blocked off. In order to suppress the phenomenon of the lateral spreading current being blocked off, in this embodiment, any regional cell 1422 on the transparent conductive layer 142 has a distance d of not more than 300 micrometers from a nearest part of the metallic conductive layer 144. Additionally, when an exposed portion uncovered by the metallic conductive layer 144 of the transparent conductive layer 142 has an area of at least 80% of a total area of the transparent conductive layer 142, the phenomenon of the lateral spreading current being blocked off resulting from the existence of crystal grain boundaries and crystal defects can be effectively suppressed. Accordingly, lateral current spreading of the present solid-state light emitting device 10 is high and thus relatively high light extraction efficiency can be achieved.

Of course, the width of the extending arms 1444 can be properly changed to ensure that any regional cell 1422 on the transparent conductive layer 142 has a distance d of not more than 300 micrometers from a nearest part of the metallic conductive layer 144.

Because the internal resistance of the N-type semiconductor layer 121 is lower than that of the P-type semiconductor layer 123, and the internal resistance of the N-type semiconductor layer 121 is close to that of the transparent conductive layer 142, when a current is provided to the contact pad 132, electrons flows into N-type semiconductor layer 121 via the contact pad 132. Due to the existence of the current induced electrode 131, an equal potential channel with lower resistance is formed between the current induced electrode 131 and the contact pad 132, which facilitates the electrons spreading laterally in the N-type semiconductor layer 121, and flows into the active layer 122 uniformly. Thereby, most area of the active layer 122 is efficiently utilized and a high light extraction efficiency can be achieved.

Finally, it is to be understood that the above-described embodiments are intended to illustrate rather than limit the invention. Variations may be made to the embodiments without departing from the spirit of the invention as claimed. The above-described embodiment illustrates the scope of the invention but do not restrict the scope of the invention.

What is claimed is:

1. A solid-state light emitting device, comprising:
  a substrate;
  a light emitting structure formed on the substrate, the light emitting structure comprising a first-type semiconductor layer, a second-type semiconductor layer and an active layer between the first-type semiconductor layer and the second-type semiconductor layer;
  a first electrode electrically connected with the first-type semiconductor layer, the first electrode comprising a first contact pad and a current-induced electrode spaced apart from the first contact pad; and
  a second electrode having an opposite polarity with respect to the first electrode, the second electrode comprising a transparent conductive layer formed on and electrically connected with the second-type semiconductor layer and a metallic conductive layer formed on the transparent conductive layer and in electrical contact therewith;
  wherein the substrate is dielectric, the first-type semiconductor layer being formed on the substrate and partly covered by the second-type semiconductor layer and the active layer, the first-type semiconductor layer having an exposed portion uncovered by the active layer and the second-type semiconductor layer, the first electrode being formed on and electrically contacting with the exposed portion of the first-type semiconductor layer, and the metallic conductive layer being at an opposite side of the transparent conductive layer to the second-type semiconductor layer; and
  wherein the metallic conductive layer includes two second contact pads and three straight strip-shaped extending arms, one of the three extending arms interconnecting the two second contact pads, the other two of the three extending arms extending from the two second contact pads, respectively, and being alternately arranged with the current induced electrode of the first electrode.

2. The solid-state light emitting device of claim 1, wherein any point on the transparent conductive layer being not more than 300 micrometers from a nearest part of the metallic conductive layer, and an exposed portion uncovered by the metallic conductive layer of the region having an area of at least 80% of a total area of the transparent conductive layer.

3. The solid-state light emitting device of claim 1, wherein the transparent conductive layer is in ohmic contact with the second-type semiconductor layer.

4. The solid-state light emitting device of claim 1, wherein the metallic conductive layer comprises a second contact pad and an extending arm extending from.

* * * * *